(12) United States Patent
Ngo et al.

(10) Patent No.: US 8,022,468 B1
(45) Date of Patent: *Sep. 20, 2011

(54) ULTRAVIOLET RADIATION BLOCKING INTERLAYER DIELECTRIC

(75) Inventors: Minh Van Ngo, Fremont, CA (US); Wenmei Li, Sunnyvale, CA (US); Jeffrey A. Shields, Sunnyvale, CA (US); Ning Cheng, San Jose, CA (US); Angela Hui, Fremont, CA (US); Cinti Xiaohua Chen, Fremont, CA (US)

(73) Assignees: Spansion LLC, Sunnyvale, CA (US); Advanced Micro Devices, Inc., Sunnyvale, CA (US)

( * ) Notice: Subject to any disclaimer, the term of this patent is extended or adjusted under 35 U.S.C. 154(b) by 1 day.

This patent is subject to a terminal disclaimer.

(21) Appl. No.: 11/091,519

(22) Filed: Mar. 29, 2005

(51) Int. Cl.
    *H01L 29/66* (2006.01)
(52) U.S. Cl. .................. 257/325; 257/E29.309
(58) Field of Classification Search ............ 257/325, 257/E29.309
    See application file for complete search history.

(56) References Cited

U.S. PATENT DOCUMENTS

| | | | |
|---|---|---|---|
| 6,268,299 B1* | 7/2001 | Jammy et al. | 438/791 |
| 6,274,429 B1* | 8/2001 | Misra | 438/257 |
| 6,395,644 B1* | 5/2002 | Hopper et al. | 438/738 |
| 6,458,649 B1* | 10/2002 | Zahurak et al. | 438/253 |
| 6,677,213 B1* | 1/2004 | Ramkumar et al. | 438/308 |
| 6,774,432 B1* | 8/2004 | Ngo et al. | 257/325 |
| 2002/0111014 A1* | 8/2002 | Jeng et al. | 438/631 |
| 2003/0096475 A1* | 5/2003 | Bloom et al. | 438/257 |
| 2003/0181030 A1* | 9/2003 | Hsu et al. | 438/624 |
| 2004/0097085 A1* | 5/2004 | Tran | 438/690 |
| 2004/0142526 A1* | 7/2004 | Bae | 438/200 |
| 2004/0183204 A1* | 9/2004 | Cave et al. | 257/774 |
| 2004/0191994 A1* | 9/2004 | Williams et al. | 438/270 |
| 2004/0214446 A1* | 10/2004 | Kim et al. | 438/706 |
| 2004/0227172 A1* | 11/2004 | Park | 257/295 |
| 2006/0151818 A1* | 7/2006 | Toumiya | 257/294 |

* cited by examiner

*Primary Examiner* — Bradley K Smith
*Assistant Examiner* — Amar Movva
(74) *Attorney, Agent, or Firm* — Harrity & Harrity, LLP (57) ABSTRACT

A memory device may include a substrate, a first dielectric layer formed over the substrate and a charge storage element formed over the first dielectric layer. The memory device may also include a second dielectric layer formed over the charge storage element and a control gate formed over the second dielectric layer. The memory device may further include an interlayer dielectric formed over the control gate and the substrate, where the interlayer dielectric includes a material that is substantially opaque to ultraviolet radiation.

12 Claims, 13 Drawing Sheets

ULTRAVIOLET RADIATION BLOCKING INTERLAYER DIELECTRIC

TECHNICAL FIELD

The present invention relates generally to semiconductor devices and methods of manufacturing semiconductor devices. The invention has particular applicability to memory devices and reducing unintended charging of memory devices.

BACKGROUND ART

The escalating demands for high density and performance associated with non-volatile memory devices require small design features, high reliability and increased manufacturing throughput. The reduction of design features, however, challenges the limitations of conventional methodology. For example, the reduction of design features makes it difficult for the memory device to meet its expected data retention requirement.

In addition, various processes that are used to complete the formation of a working memory device, such as an electrically erasable programmable read only memory (EEPROM) device, often create problems associated with the operation of the memory device. For example, ultraviolet (UV) radiation exposure during various processes, such as backend of line (BEOL) processes, may create a charge buildup in a charge storage element of the memory device. This charge buildup may make it difficult to program and/or erase the memory device in an efficient manner and, ultimately, may lead to device failure.

DISCLOSURE OF THE INVENTION

Implementations consistent with the invention reduce UV radiation-induced charging problems in a memory device by using one or more UV radiation blocking materials during fabrication of the memory device. The UV radiation blocking material(s) may be part of an interlayer dielectric and help reduce or eliminate undesired charge buildup in the memory device.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to one aspect consistent with the invention, a memory device is provided. The memory device includes a substrate, a first dielectric layer formed over the substrate and a charge storage element formed over the first dielectric layer. The memory device also includes a second dielectric layer formed over the charge storage element and a control gate formed over the second dielectric layer. The memory device further includes a first interlayer dielectric formed over the control gate and the substrate, where the first interlayer dielectric includes a first material that is substantially opaque to ultraviolet radiation.

According to another aspect consistent with the invention, a semiconductor device is provided. The semiconductor device includes a number of memory cells formed on a substrate. The semiconductor device also includes a first dielectric layer formed over the memory cells. The first dielectric layer contacts an upper surface of the substrate and includes a first material that blocks a majority of ultraviolet radiation from reaching the memory cells.

According to a further aspect consistent with the invention, a non-volatile memory device is provided. The non-volatile memory device includes a substrate, a first dielectric material formed over the substrate and a charge storage element formed over the first dielectric material. The non-volatile memory device also includes a second dielectric material formed over the charge storage element and a control gate formed over the second dielectric material. The non-volatile memory device also includes a first interlayer dielectric formed over the control gate. The first interlayer dielectric contacts an upper surface of the substrate and includes a material that is substantially opaque to ultraviolet radiation. The non-volatile memory device further includes a second interlayer dielectric formed over the first interlayer dielectric.

Other advantages and features of the invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

Figure 1:
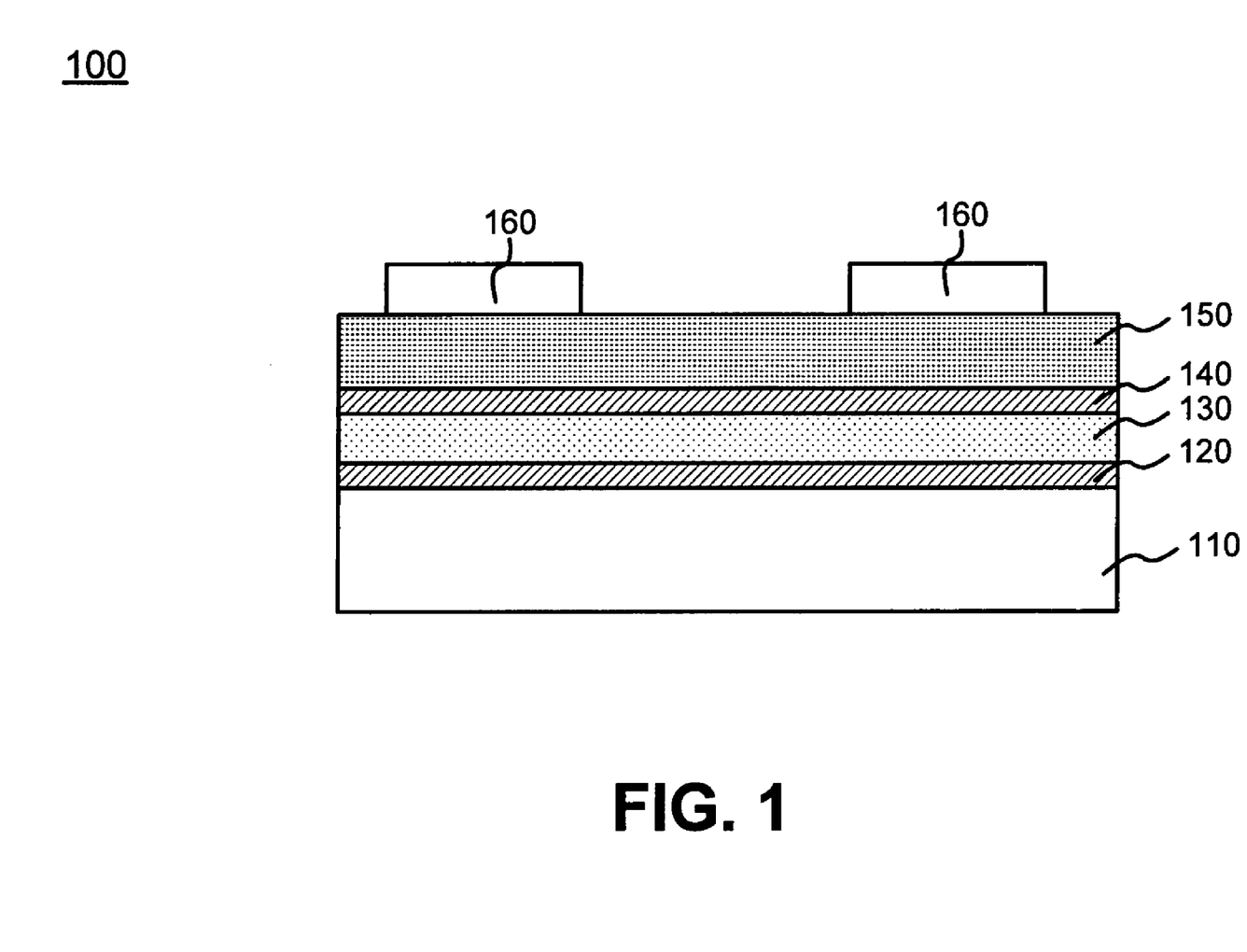
FIG. 1 is a cross-section illustrating exemplary layers used to form memory cells in accordance with an embodiment of the invention.

FIG. 1 illustrates the cross-section of a semiconductor device 100 formed in accordance with an embodiment of the invention. Referring to FIG. 1, semiconductor device 100 may include layers 110, 120, 130, 140 and 150. In an exemplary embodiment, layer 110 may be a substrate of semiconductor device 100 and may include silicon, germanium, silicon-germanium or other semiconducting materials. In alternative implementations, layer 110 may be a conductive layer or a dielectric layer formed a number of layers above the surface of a substrate in semiconductor device 100.

Layer 120 may be a dielectric layer formed on layer 110 in a conventional manner. In an exemplary implementation, dielectric layer 120 may include an oxide, such as a silicon oxide (e.g., $SiO_2$), and may have a thickness ranging from about 50 angstroms (Å) to about 100 Å. Dielectric layer 120 may function as a tunnel oxide layer for a subsequently formed memory cell of semiconductor device 100.

Layer 130 may be formed on layer 120 in a conventional manner and may include a dielectric material, such as a nitride (e.g., a silicon nitride) or an oxynitride. Layer 130, consistent with the invention, may act as a charge storage layer for semiconductor device 100 and may have a thickness ranging from about 80 Å to about 120 Å. In alternative implementations, layer 130 may include a conductive material, such as polycrystalline silicon, used to form a floating gate electrode.

Layer 140 may be formed on layer 130 in a conventional manner and may include a dielectric material, such as an oxide (e.g., $SiO_2$). Alternatively, layer 140 may include a material having a high dielectric constant (K) that may be deposited or thermally grown on layer 130. For example, layer 140 may include an aluminum oxide or hafnium oxide, or a material having a K value ranging from, for example, 12 to 20. In still other alternatives, layer 140 may be a composite that includes a number of dielectric layers or films. Layer 140 may have a thickness ranging from about 60 Å to about 90 Å and may function as an inter-gate dielectric for memory cells in semiconductor device 100.

Layer 150 may include a conductive material, such as polycrystalline silicon, formed on layer 140 in a conventional manner. Alternatively, layer 150 may include other semiconducting materials, such as germanium or silicon-germanium, or various metals, such as titanium or tungsten. Layer 150, consistent with the invention, may be used to form one or more control gate electrodes for one or more memory cells in semiconductor device 100. In an exemplary implementation, layer 150 may have a thickness ranging from about 1,000 Å to about 2,000 Å. An optional silicide layer, such as titanium silicide (not shown) may be formed on layer 150.

A photoresist material may be patterned and etched to form masks 160 on the top surface of layer 150, as illustrated in FIG. 1. Masks 160 may be used to facilitate formation of one or memory cells in semiconductor device 100, as described in more detail below.

Figure 2:
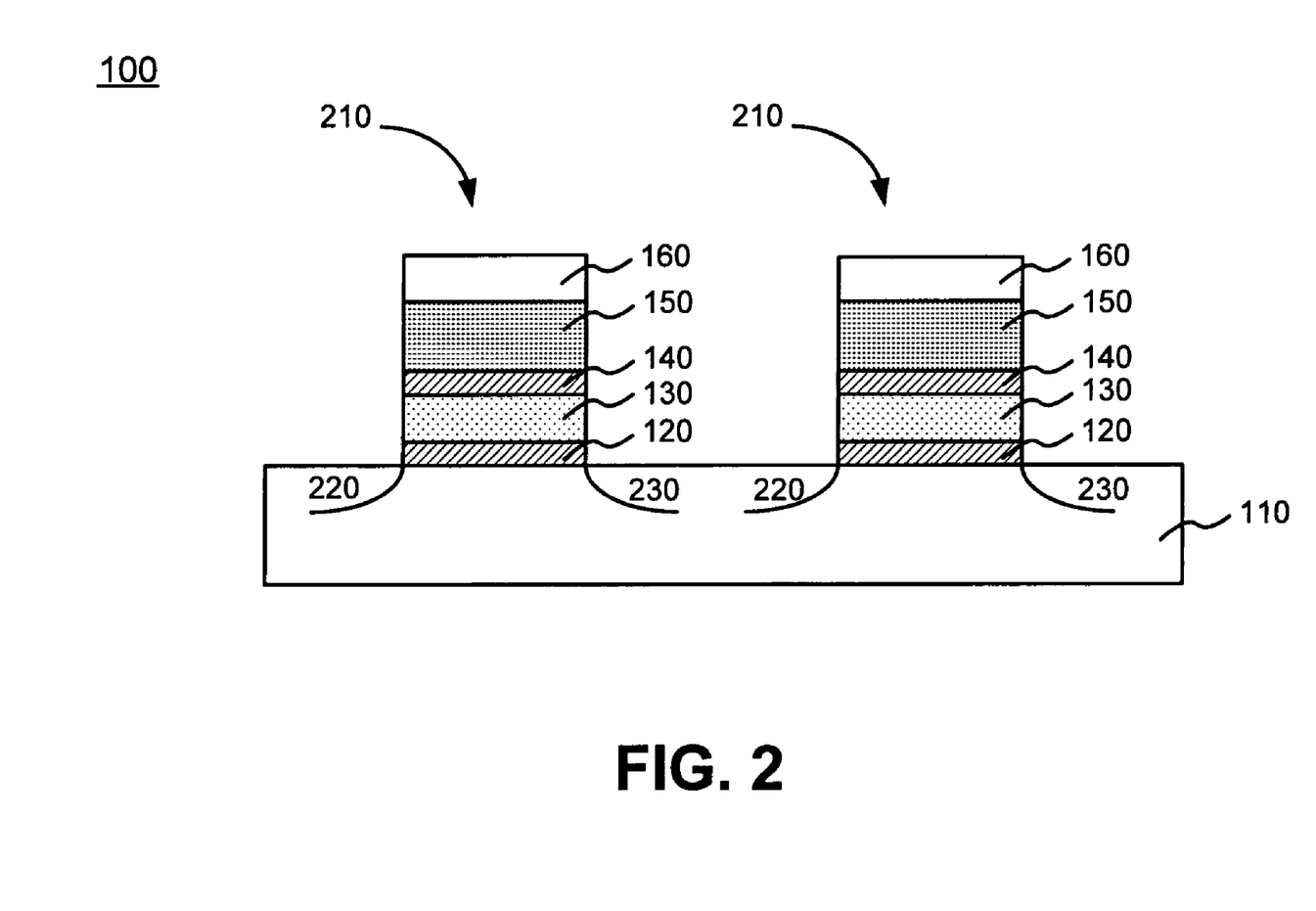
FIG. 2 is a cross-section illustrating the formation of memory cells in accordance with an embodiment of the invention.

Semiconductor device 100 may then be etched, as illustrated in FIG. 2. Referring to FIG. 2, layers 120-150 may be etched in a conventional manner with the etching terminating at substrate 110, thereby forming structures 210. Each structure 210 (also referred to herein as a memory cell 210) may represent a memory cell of semiconductor device 100, where each memory cell 210 includes a dielectric layer 120, a charge storage layer 130, an inter-gate dielectric layer 140 and a control gate 150. Only two memory cells 210 are illustrated in semiconductor device 100 in FIG. 2 for simplicity. It should be understood that semiconductor device 100 may typically include a memory array including a large number of memory cells 210.

In an exemplary implementation consistent with the invention, each memory cell 210 may be a SONOS-type memory cell, with a silicon control gate electrode 150 formed on an oxide-nitride-oxide (ONO) stack (i.e., layers 140, 130 and 120), with nitride layer 130 acting as a charge storage layer, and the ONO stack being formed on a silicon substrate 110.

Source and drain regions 220 and 230 may then be formed in substrate 110, as illustrated in FIG. 2. For example, n-type or p-type impurities may be implanted in substrate 110 to form source and drain regions 220 and 230, based on the particular end device requirements. The particular implantation dosages and energy used to form source and drain regions 220 and 230 may be selected based on the particular end device requirements. One of ordinary skill in the art would be able to optimize the source/drain implantation process based on the particular circuit requirements. It should also be understood that source region 220 and drain region 230 may alternatively be formed at other points in the fabrication process of semiconductor device 100. For example, sidewall spacers may be formed prior to the source/drain ion implantation to control the location of the source/drain junctions based on the particular circuit requirements.

Figure 3:
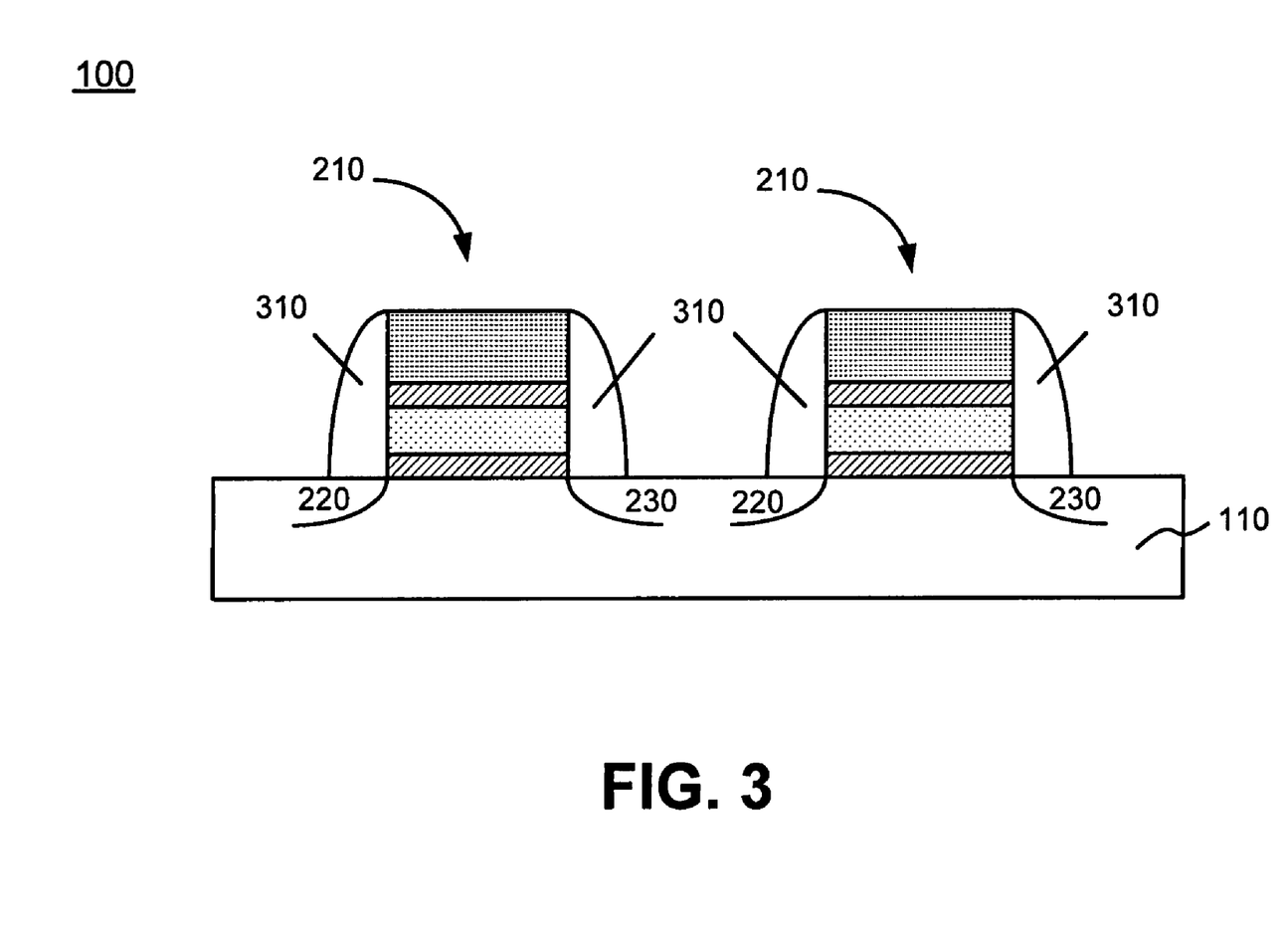
FIG. 3 is a cross-section illustrating the formation of spacers on the device of FIG. 2 in accordance with an embodiment of the invention.

Photoresist masks 160 may be removed using a conventional process. Spacers 310 may be formed adjacent the sidewalls of the memory cells 210, as illustrated in FIG. 3. For example, a dielectric material, such as a silicon oxide, a silicon nitride, a silicon oxynitride or another dielectric material, may be deposited and etched to form spacers 310 on each side of memory cells 210, as illustrated in FIG. 3. Spacers 310 may be used to electrically isolate adjacent memory cells 210 from each other. Spacers 310 may also be used to facilitate the deposition of impurities in semiconductor device 100.

Figure 4:
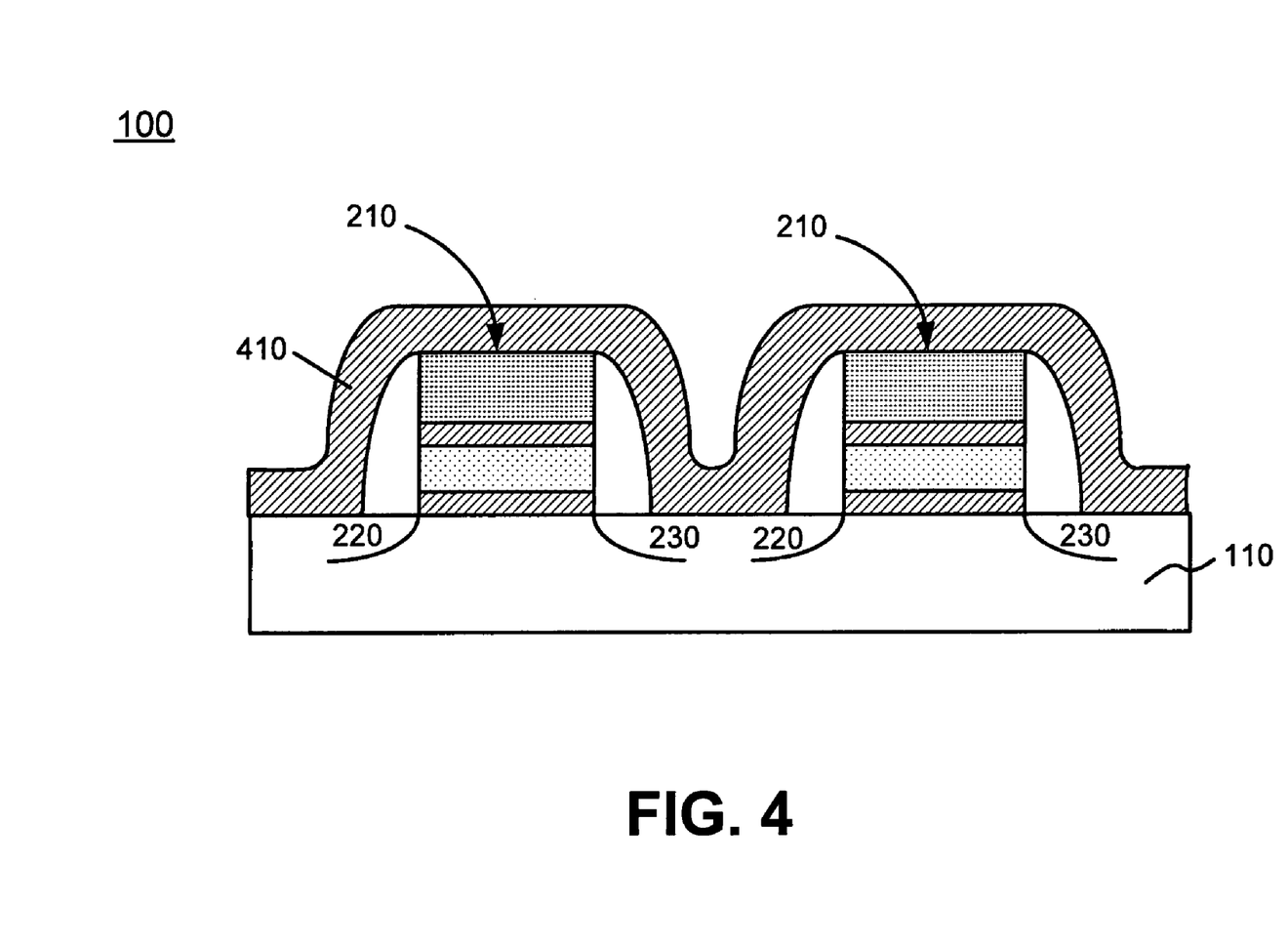
FIG. 4 is a cross-section illustrating the formation of an ultraviolet radiation blocking layer on the device of FIG. 3 in accordance with an embodiment of the invention.

A dielectric layer 410 may then be deposited over semiconductor device 100, as illustrated in FIG. 4. In an exemplary embodiment, dielectric layer 410 may include a material (referred to herein as "a UV blocking material") that blocks all or nearly all of the incident UV radiation associated with subsequent processing steps from reaching memory cells 210. That is, dielectric material 410 may be substantially opaque to UV radiation and may have a refractive index ranging from about 2.15 to about 2.65. In an exemplary embodiment, dielectric layer 410 may have a thickness ranging from about 250 Å to about 650 Å and may block about 95% to about 100% of UV radiation from reaching memory cells 210. Dielectric layer 410, consistent with the invention, may include an oxide, such as a silicon-rich oxide (SiRO), a nitride, such as a silicon-rich nitride (SiRN), a silicon/silicon-rich oxynitride (SiON), a silicon/silicon-rich oxycarbide (SiOC), a silicon/silicon-rich carbonitride (SiCN), a silicon/silicon-rich-carbon-oxygen-hydrogen (SiCOH) compound or some combination of these materials.

The term "silicon-rich" is well known in the art and denotes a silicon-rich form of the particular compound. For example, silicon nitride is generally denoted by the empirical formula $Si_3N_4$. A silicon-rich silicon nitride (SiRN) may be denoted by the formula $Si_xN_4$, where the value of $x>3$. For example, x may range from 3.01 to about 4. Similarly, silicon carbide is generally denoted by the empirical formula SiC. Silicon-rich silicon carbide may be represented as $Si_xC_y$, where $x>y$ and $x+y=2$. For example, x may be about 1.2 and y may be about 0.8.

It should be understood that the above values are exemplary only and in general, the silicon-rich versions of the particular compounds used to form dielectric layer 410 include a greater amount of silicon than that used in the empirical version of the respective compound.

In one exemplary embodiment in which dielectric layer 410 is formed using a silicon nitride, dielectric layer 410 may be a SiRN deposited via a plasma-enhanced chemical vapor deposition (PECVD) to a thickness ranging from about 250 Å to about 650 Å. In this embodiment, the SiRN layer 410 may have a refractive index (RI) of greater than about 2.2, such as about 2.5. It has been found that the SiRN formed to this thickness and having this RI advantageously provides good UV radiation blocking for memory cells 210 and also acts as a good liner for a subsequently deposited interlayer dielectric (ILD).

In each case, dielectric layer 410 advantageously blocks UV radiation from charging charge storage layer 130 in semiconductor device 100. This reduced charging problem enables memory cells 210 to be programmed and/or erased in an efficient manner and helps improve reliability for memory cells 210. Dielectric layer 410 may also act as a low compressive stress film that acts as a good liner for a subsequently formed ILD.

Figure 5A:
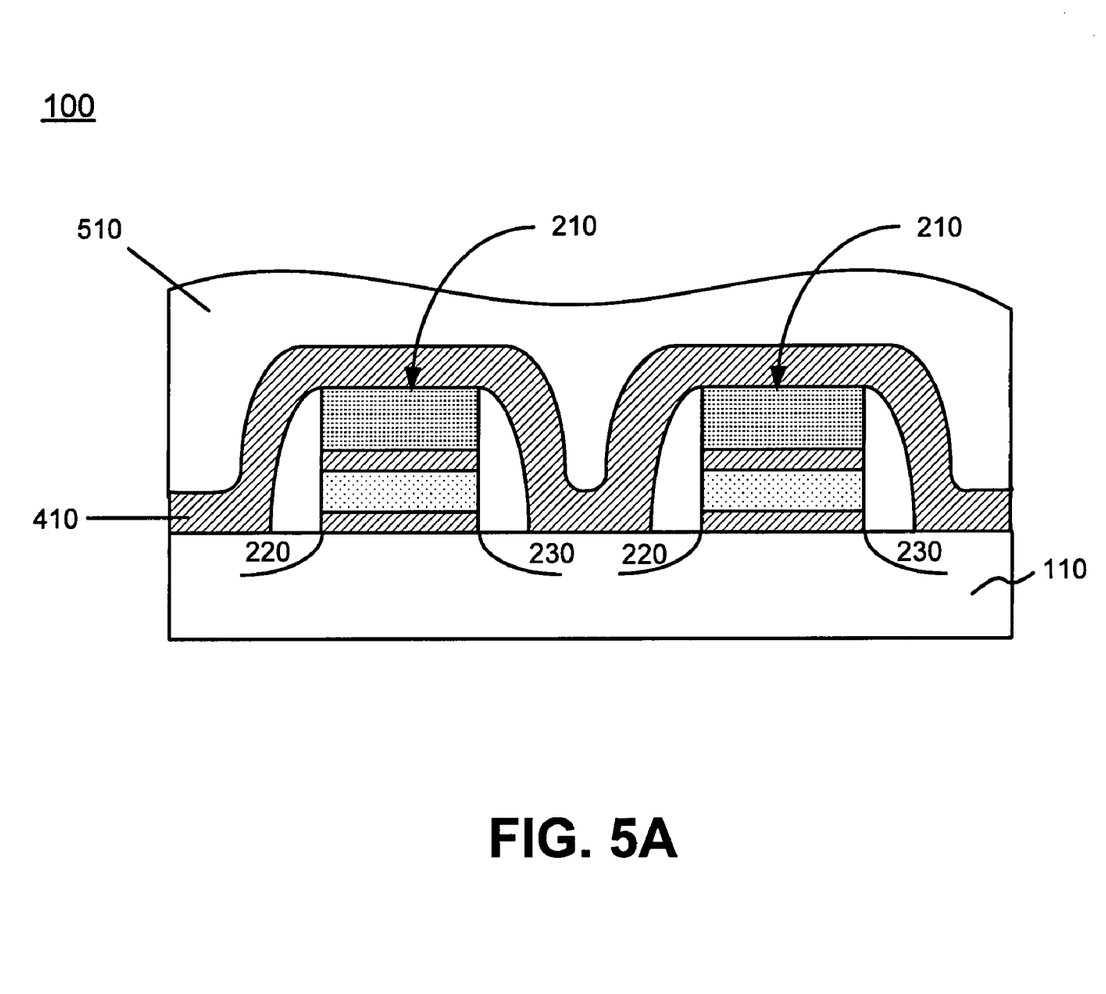
FIG. 5A is a cross-section illustrating the formation of an interlayer dielectric on the device of FIG. 4 in accordance with an embodiment of the invention.

An ILD 510 may be formed on dielectric layer 410, as illustrated in FIG. 5A. In an exemplary implementation, ILD layer 510 may include a phosphosilicate glass (PSG) material, a boro-phosphosilicate glass (BPSG) material, an oxide or some other dielectric material. The thickness of ILD 510 may range from about 5,500 Å to about 8,500 Å.

Figure 5B:
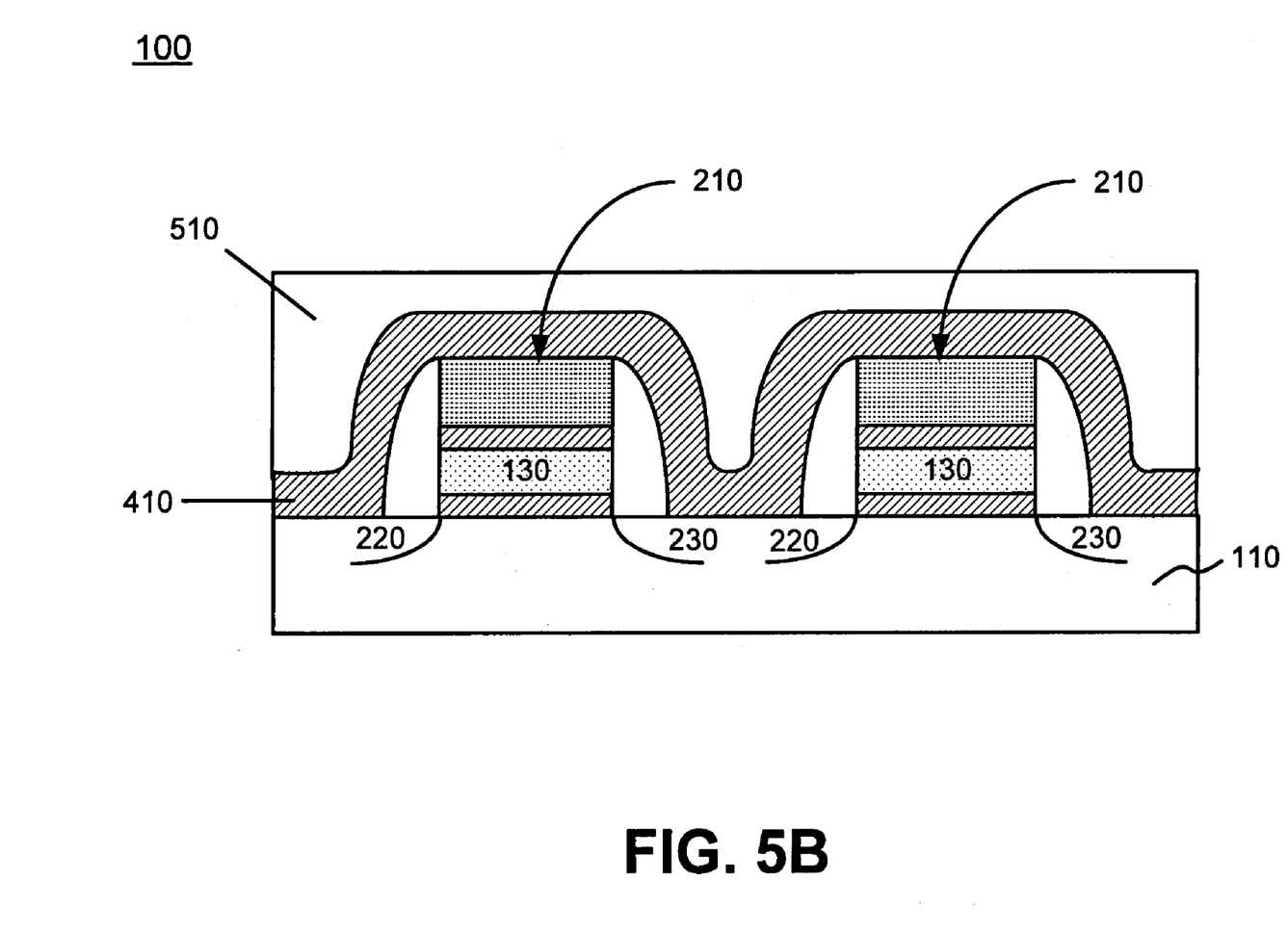
FIG. 5B is a cross-section illustrating the planarization of the interlayer dielectric of FIG. 5A in accordance with an embodiment of the invention.

ILD 510 may optionally be planarized using a conventional process, such as a chemical-mechanical polishing (CMP) process, as illustrated in FIG. 5B. Referring to FIG. 5B, the CMP process may planarize the top surface of ILD 510 to facilitate formation of subsequent structures, such as interconnect lines. ILD 510, consistent with the invention, may represent an ILD located closest to substrate 110. In alternative implementations, ILD 510 may represent an interlayer dielectric formed a number of layers above the surface of substrate 110. In each case, ILD 510 functions to isolate various conductive structures, such as various interconnect lines described below or to isolate source region 220 or drain region 230 from other conductive structures.

Figure 6A:
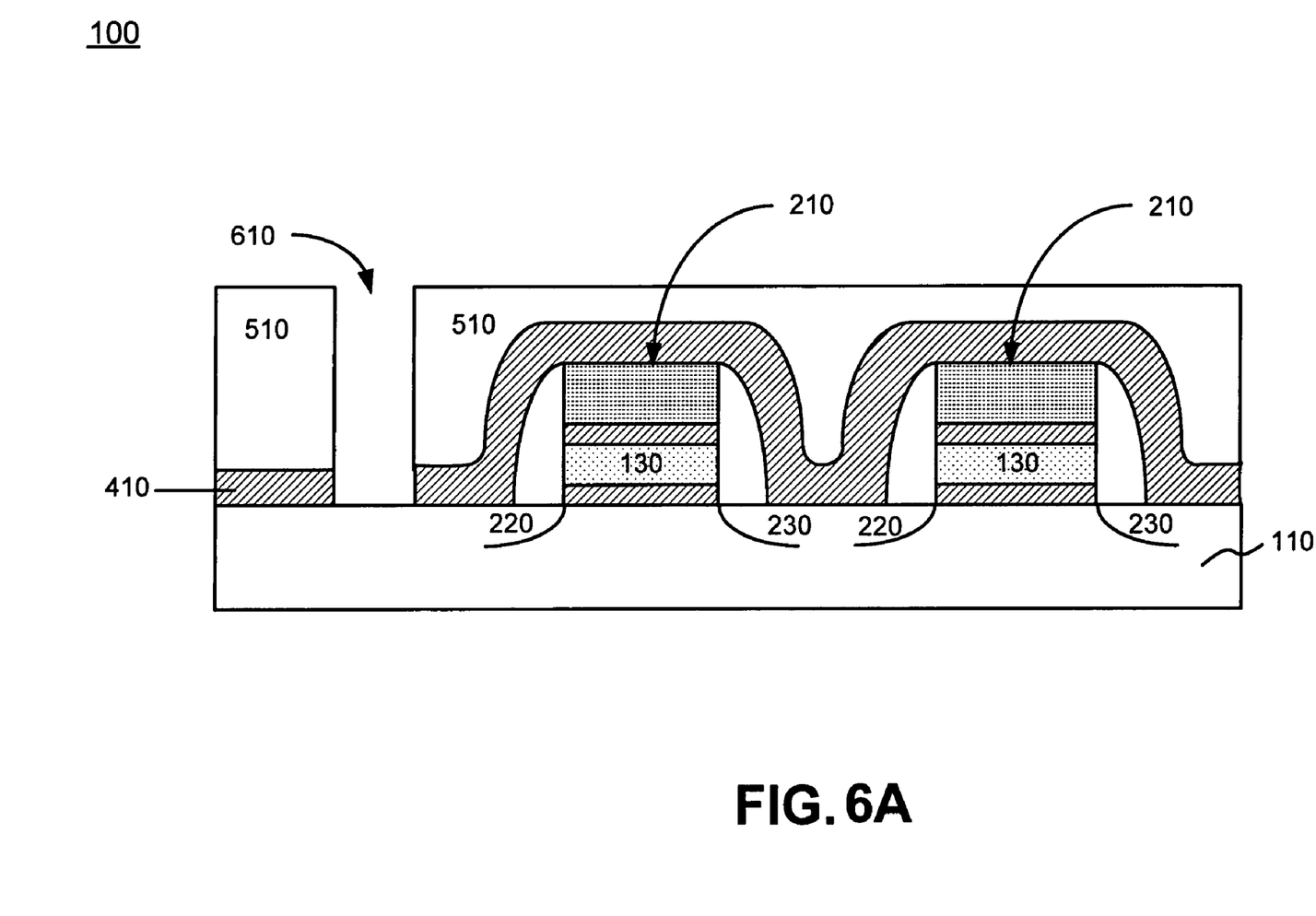
FIGS. 6A and 6B are cross-sections illustrating the formation of a contact in the interlayer dielectric of FIG. 5B in accordance with an embodiment of the invention.
Figure 6B:
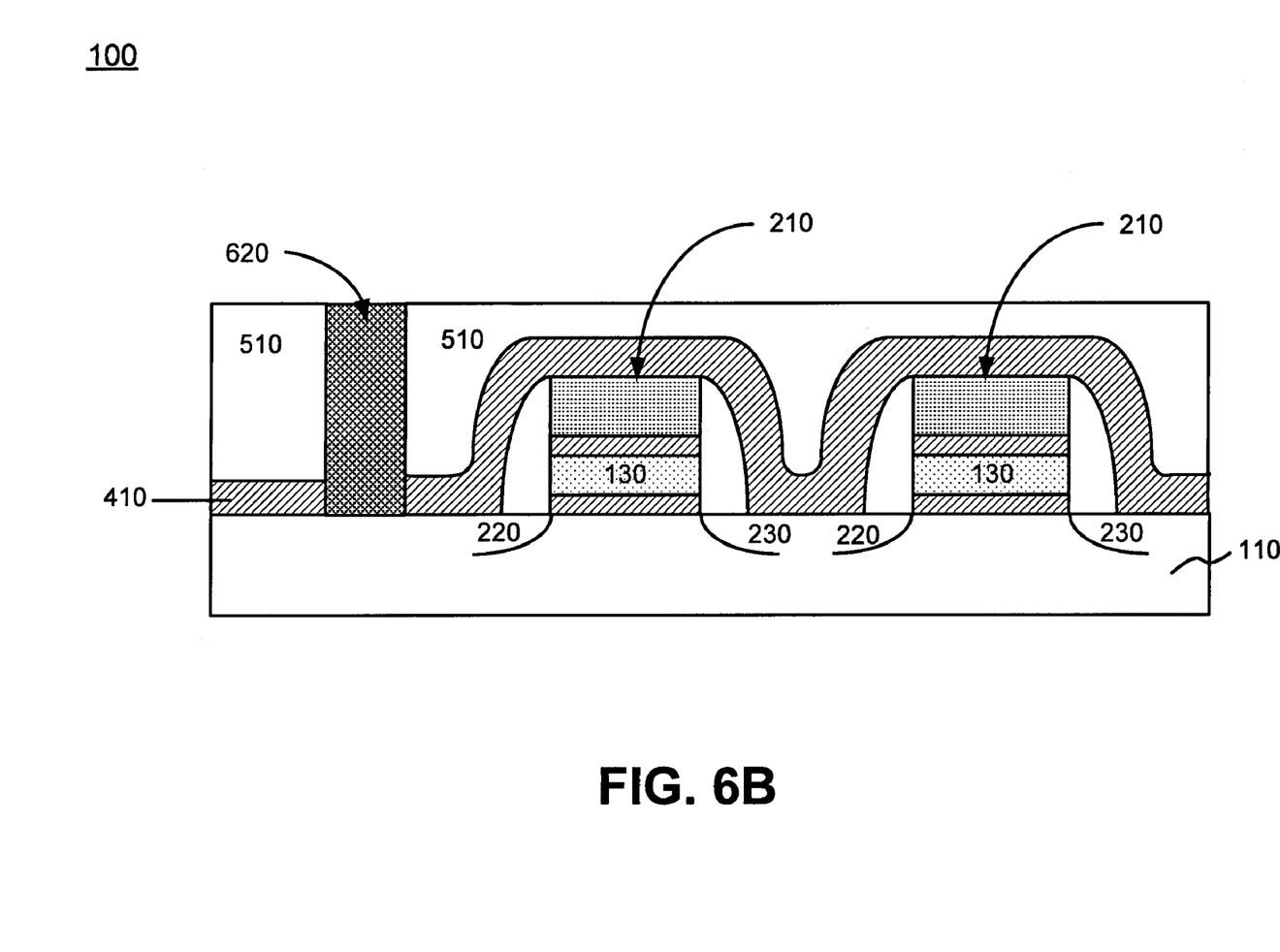

A contact hole 610 may be formed in ILD 510 and dielectric layer 410 using conventional photolithographic and etching techniques, as illustrated in FIG. 6A. Contact hole 610 may be used to form a contact to source region 220 or drain region 230. Next, a metal layer 620, such as tungsten, aluminum or copper, may be deposited to fill contact hole 610, as illustrated in FIG. 6B. Metal layer 620 may represent a contact to, for example, source region 220.

Figure 7:
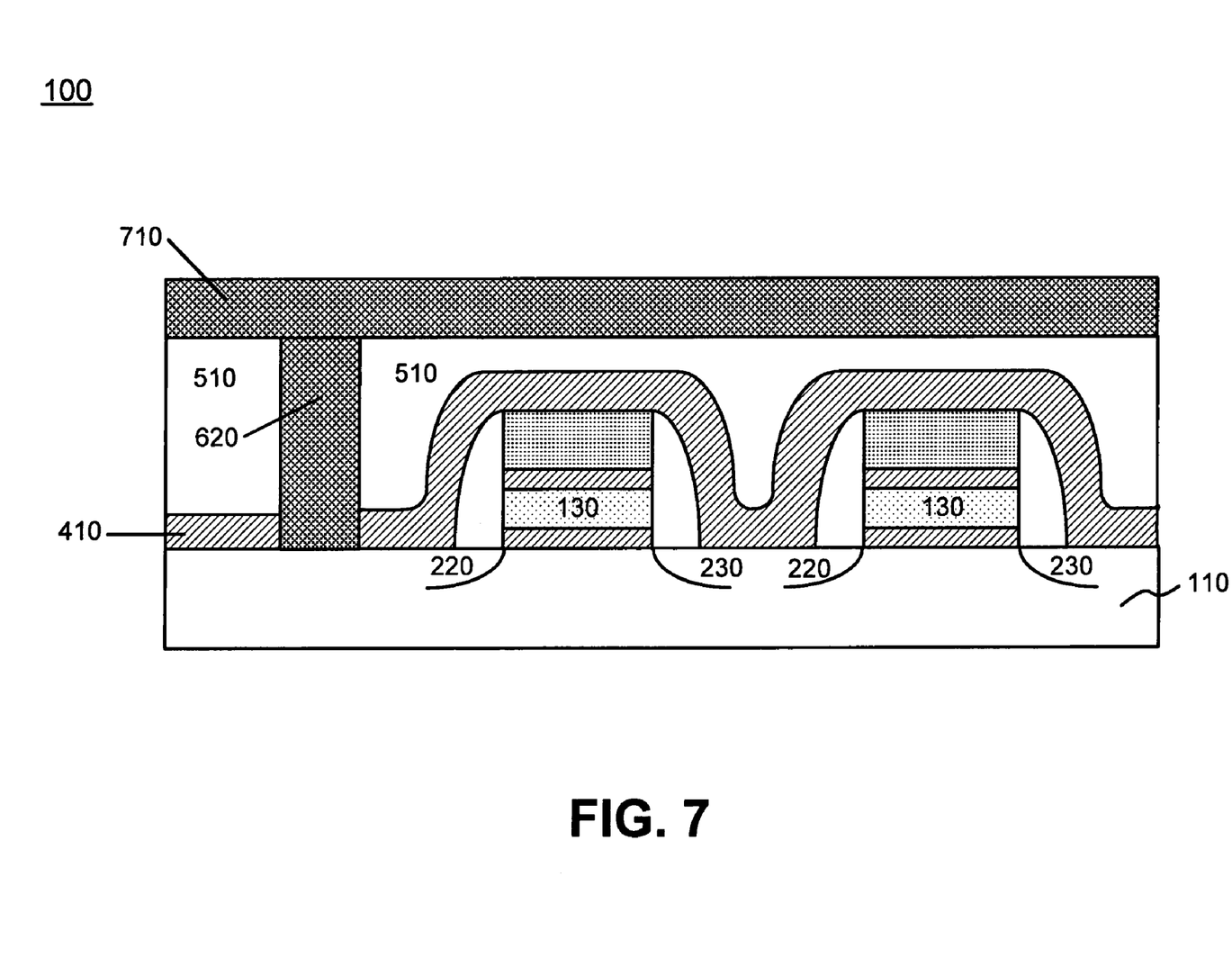
FIG. 7 is a cross-section illustrating the formation of a conductive interconnect on the device of FIG. 6B in accordance with an embodiment of the invention.

A conductive interconnect line 710 may then be formed over the planarized top surface of ILD 510, as illustrated in FIG. 7. For example, a metal, such as copper or aluminum, may be deposited to form conductive line 710 that connects various features in semiconductor device 100, such as source or drain regions 220/230 through contact 620 to an external electrode (not shown). Alternatively, conductive line 710 may connect various memory cells 210 in semiconductor device 100. Conductive line 710 may facilitate programming or erasing various memory cells 210 in semiconductor device 100.

Figure 8:
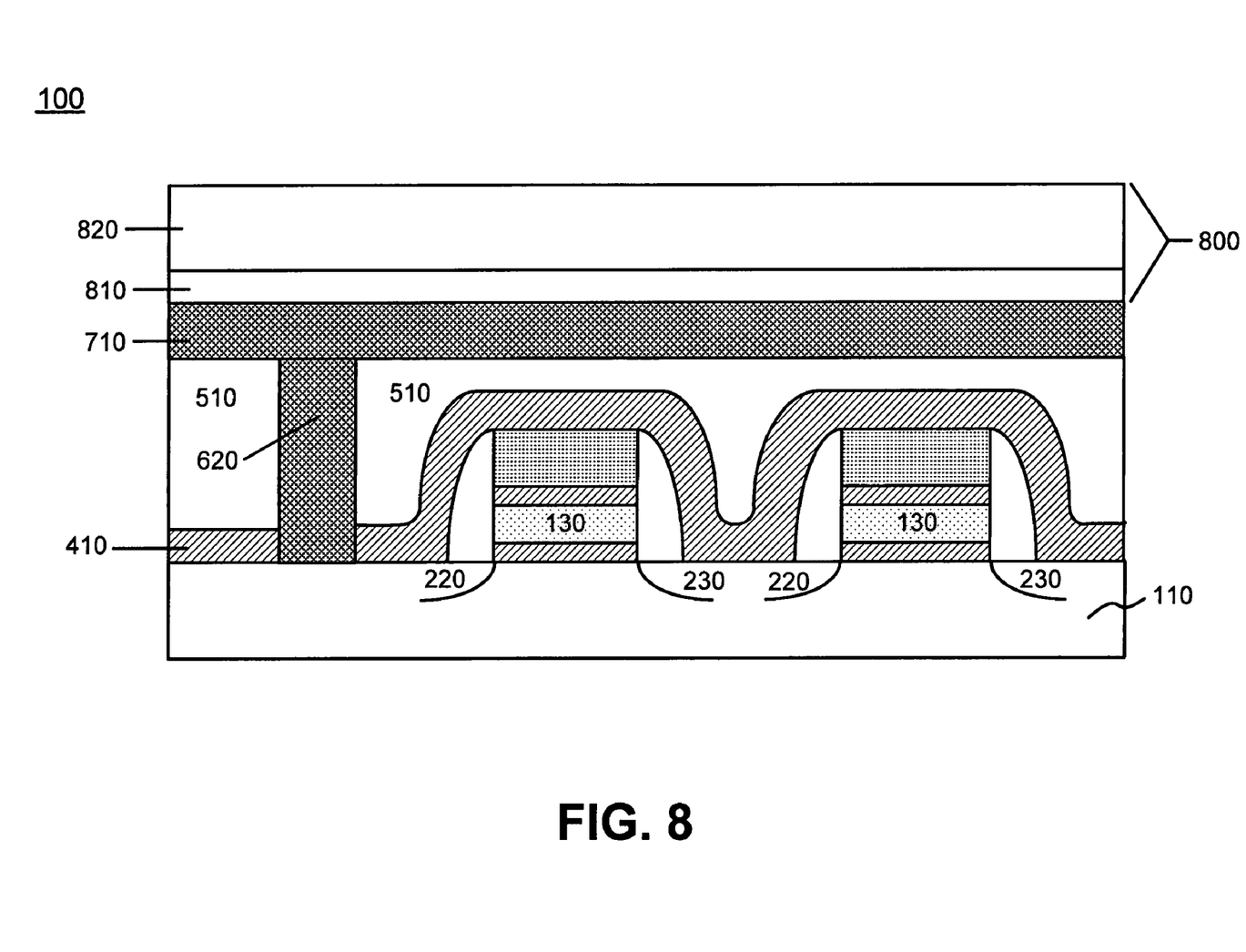
FIG. 8 is a cross-section illustrating the formation of an interlayer layer dielectric on the device of FIG. 7 in accordance with an embodiment of the invention.

An ILD 800 may be formed over conductive line 710, as illustrated in FIG. 8. ILD 800, consistent with the invention, may include an ILD liner 810 and a dielectric layer 820 formed on ILD liner 810. Similar to dielectric layer 410, in an exemplary embodiment, ILD liner 810 may be a UV-blocking material that blocks incident UV radiation from reaching memory cells 210 and inadvertently charging charge storage layer. For example, ILD liner 810 may include an SiRO, an SiRN, a silicon/silicon-rich SiON, a silicon/silicon-rich SiCN, a silicon/silicon-rich SiCOH compound or some combination of these or other dielectric materials. ILD liner 810 may have a thickness ranging from about 250 Å to about 650 Å and may block about 95% to about 100% of UV radiation from reaching memory cells 210. This UV-blocking further enhances the UV-blocking performed by dielectric layer 410 and further ensures that little or no UV radiation reaches memory cells 210 and prevents unintended charging of charge storage layer 130 in memory cells 210.

Dielectric layer 820 may be formed on ILD liner 810 to form ILD 800, as illustrated in FIG. 8. In an exemplary implementation, dielectric layer 820 may include a PSG material, a fluorine doped silicate glass (FSG) material, an oxide or some other dielectric material. The thickness of dielectric layer 820 may range from about 2,500 Å to about 3,500 Å.

Figure 9:
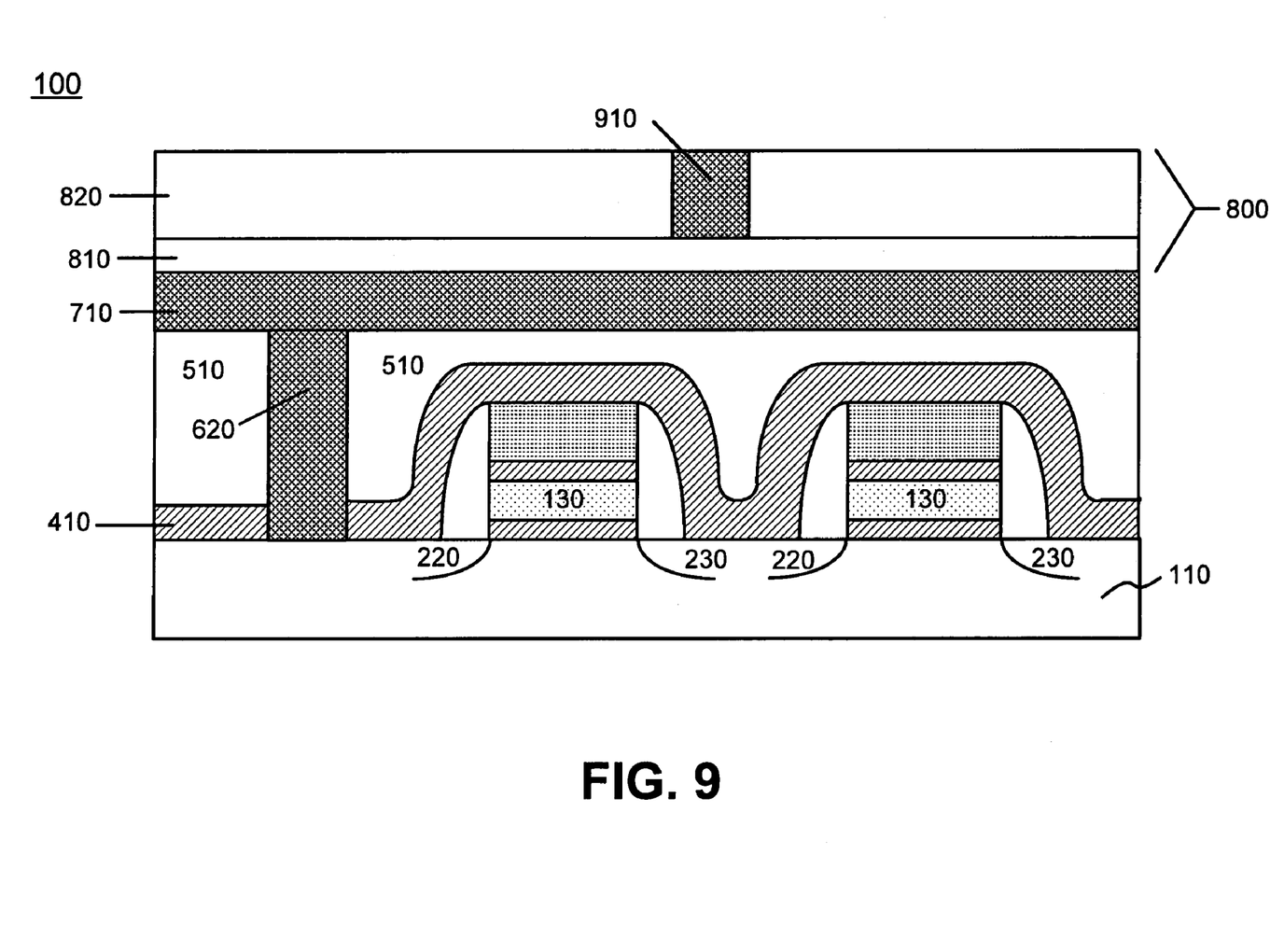
FIG. 9 is a cross-section illustrating the formation of a contact in the interlayer dielectric of FIG. 8 in accordance with an embodiment of the invention.

As described above, various BEOL processing may be performed to complete the fabrication of semiconductor device 100. For example, a trench/contact hole may be formed in ILD 800 followed by deposition of a metal layer 910, such as copper or aluminum, as illustrated in FIG. 9. Metal layer 910 may represent a contact to an uppermost conductive layer of semiconductor device 100. Alternatively, metal layer 910 may represent a contact to any one of a number of conductive layers in semiconductor device 100.

Figure 10:
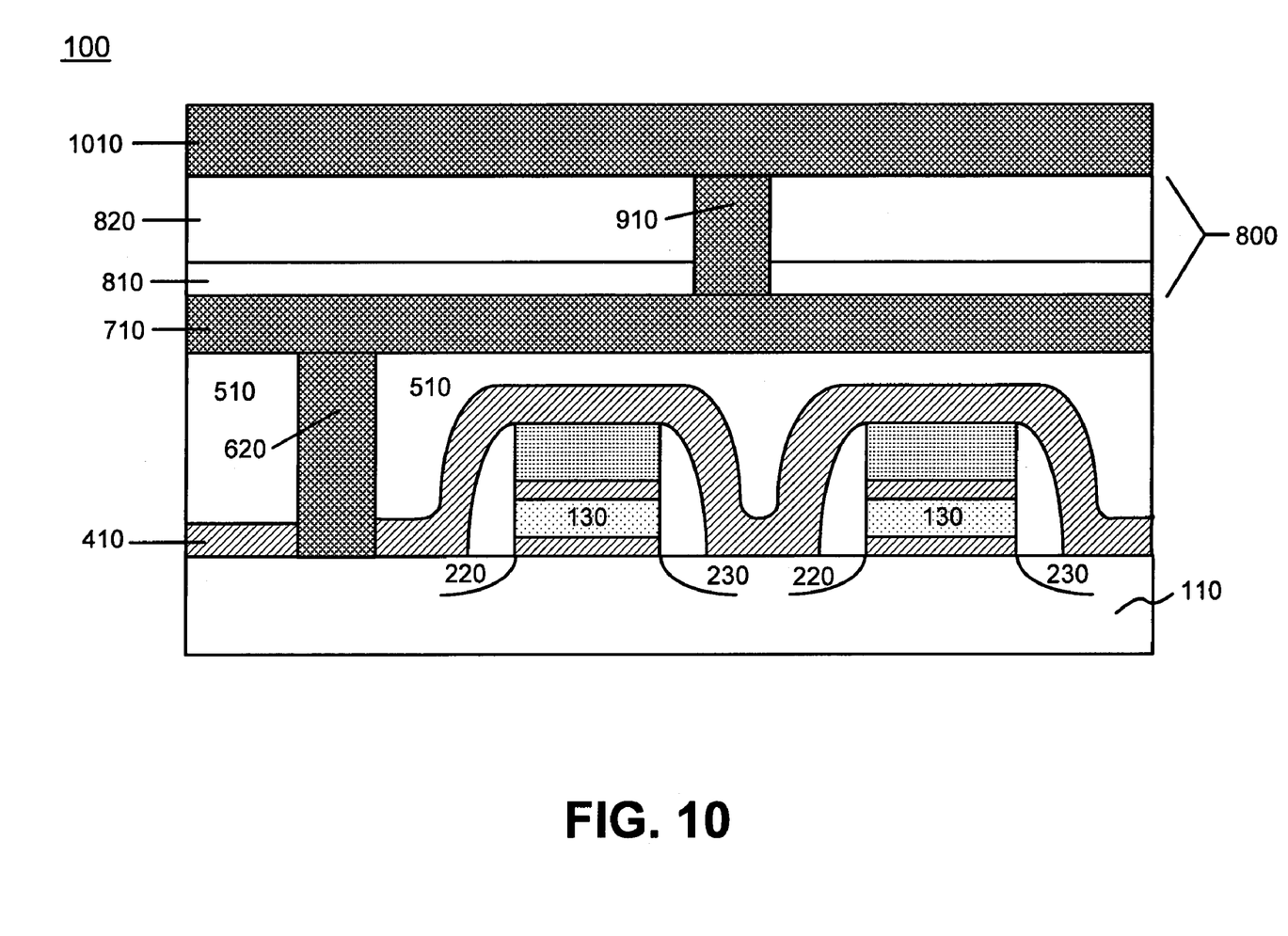
FIG. 10 is a cross-section illustrating the formation of a conductive layer on the device of FIG. 9 in accordance with an embodiment of the invention.

A conductive layer may then be formed over ILD 800. For example, a metal, such as copper or aluminum, may be deposited to form conductive line 1010, as illustrated in FIG. 10. Conductive line 1010 may represent a BEOL structure or connector that connects various features in semiconductor device 100, such as source or drain regions 220/230 to an external electrode (not shown), to facilitate programming or erasing of various memory cells 210 in semiconductor device 100.

Figure 11:
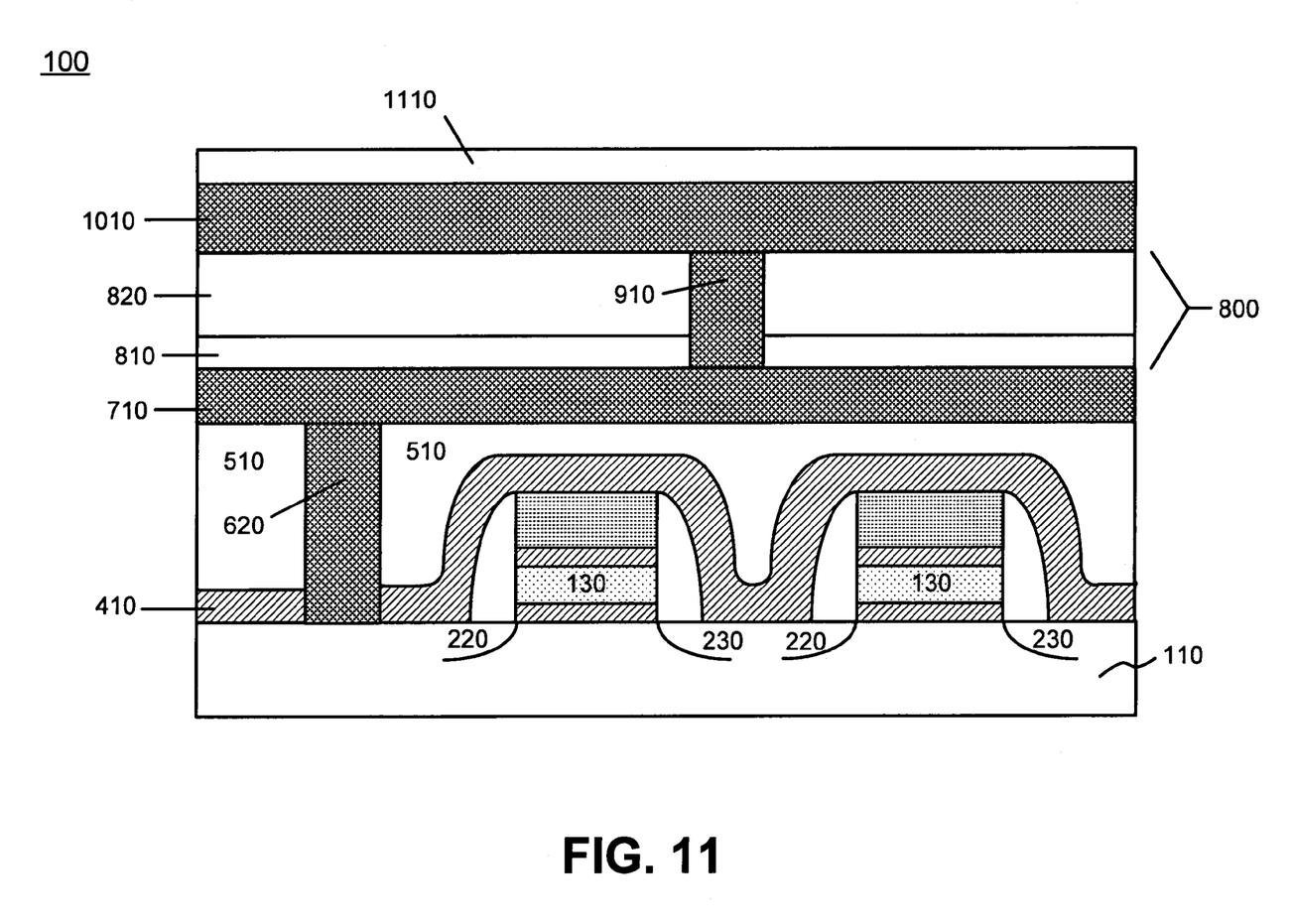
FIG. 11 is a cross-section illustrating the formation of a dielectric layer on the device of FIG. 10 in accordance with an embodiment of the invention.

A top dielectric layer 1110, also referred to as cap layer 1110, may be formed over conductive line 1010. In an exemplary embodiment, cap layer 1110 may be deposited to a thickness ranging from about 6,000 Å to about 10,000 Å. Cap layer 1110 may act as a protective layer to prevent damage to conductive line 1010 and other portions of semiconductor device 100 during subsequent processing. For example, cap layer 1110 may protect semiconductor device 100 against impurity contamination during subsequent cleaning processes that may be used to complete a working memory device.

In an exemplary embodiment, cap layer 1110 may include a UV blocking material similar to dielectric layer 410 and may also function to block incident UV radiation from reaching memory cells 210 and inadvertently charging charge storage layer 130. For example, cap layer 1110 may include an SiRO, an SiRN, a silicon/silicon-rich SiON, a silicon/silicon-rich SiCN, a silicon/silicon-rich SiCOH compound or some combination of these or other dielectric materials. In this embodiment, cap layer 1110, along with dielectric layers 410 and 810 may act to prevent unintended charging of charge storage layer 130 caused by incident UV radiation.

While only two ILDs (i.e., ILDs 510 and 800) and two conductive layers (i.e., layers 710 and 1010) are illustrated in FIG. 11 for simplicity, it should be understood that semiconductor device 100 may include more ILD layers and conductive layers based on the particular circuit requirements. In each case, one or more dielectric layers, such as dielectric layer 410, ILD liner 810 and/or cap layer 1110 may be formed using UV blocking materials that are substantially opaque to UV radiation and block substantially all incident UV radiation from reaching memory cells 210.

As described above, in an exemplary embodiment, semiconductor device 100 illustrated in FIG. 11 may be a SONOS type memory device, with nitride layer 130 acting as a charge storage element for each memory cell 210. Each memory cell 210 may be an EEPROM type memory device and one or more programming circuits (not shown) may be used to facilitate programming and erasing of one or more memory cells 210 of semiconductor device 100. Programming of memory cell 210 may be accomplished by applying a predetermined voltage to control gate 150. Once programmed, electrons remain trapped in nitride layer 130 until an erase procedure is performed.

In an exemplary implementation consistent with the invention, each of memory cells 210 illustrated in FIG. 11 may be configured to store two bits of data. That is, charge storage layer 130 may be programmed to store two separate bits of data by localizing the first and second charges to the respective left and right sides of charge storage layer 130 illustrated in FIG. 11. For example, each of the two bits of memory cell 210 may be programmed independently by, for example, channel hot electron injection, to store a bit on each respective side of the charge storage layer 130. In this manner, the charges in charge storage layer 130 become effectively trapped on each respective side of charge storage layer 130: Erasing of each bit in memory cell 210 may also be performed independently. During erasing, the bits stored in charge storage layer 130 may tunnel through dielectric layer 120 into the source region 220 and drain region 230, respectively.

In this manner, the density of the array of memory cells 210 in semiconductor device 100 may be increased as compared to conventional memory devices that store only one bit of data per cell. In alternative implementations, each memory cell 210 may be configured to store one bit of data per memory cell 210. In addition, in alternative implementations, semiconductor device 100 may be a floating gate memory device in which layer 130 is formed from a conductive material, such as polysilicon, and functions as a charge storage element for each memory cell 210.

In summary, implementations consistent with the invention use one or more UV blocking layers to prevent unintended charging of charge storage layer 130 in memory cells 210. Advantageously, the array of memory cells 210 in semiconductor device 100 may be efficiently programmed and/or erased without concern for unintended pre-charging. Memory cells 210 may also exhibit increased reliability.

In the previous descriptions, numerous specific details are set forth, such as specific materials, structures, chemicals, processes, etc., in order to provide a thorough understanding of the invention. However, implementations consistent with principles of the invention can be practiced without resorting to the details specifically set forth herein. In other instances, well known processing structures have not been described in detail, in order not to unnecessarily obscure the thrust of the invention.

For example, the dielectric and conductive layers used in manufacturing a semiconductor device in accordance with the invention can be deposited by conventional deposition techniques. For example, various types of chemical vapor deposition (CVD) processes, including low pressure chemical vapor deposition (LPCVD) and plasma enhanced chemical vapor deposition (PECVD) can be employed. In addition, conventional electroplating, photolithographic and etching techniques may also be employed, and hence, the details of such techniques have not been set forth herein in detail.

Implementations of the invention are applicable in the manufacturing of semiconductor devices and particularly in memory devices having small design features and high circuit density. The invention is applicable to the formation of any of various types of semiconductor devices, and hence, details have not been set forth in order to avoid obscuring the thrust of the invention.

In addition, no element, act or process used in the description of the invention should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A memory device, comprising:
a substrate;
a first dielectric layer formed over the substrate;
a charge storage element formed over the first dielectric layer;
a second dielectric layer formed over the charge storage element;
a control gate formed over the second dielectric layer;
a single layer formed over the control gate and the substrate and physically contacting an upper surface of the substrate, the single layer comprising a first interlayer dielectric comprising a silicon-rich silicon nitride having a refractive index ranging from 2.2 to 2.5, where the silicon-rich silicon nitride has a thickness ranging from about 250 Å to about 650 Å;
at least one conductive layer formed over the single layer;
at least one second interlayer dielectric formed over the at least one conductive layer, the at least one second interlayer dielectric comprising a material that blocks at least 95 percent of ultraviolet radiation; and
another conductive layer formed over the at least one second interlayer dielectric, where the at least one second interlayer dielectric includes a contact hole that is filled by a metal layer that connects to the at least one conductive layer and the another conductive layer.

2. The memory device of claim 1, further comprising:
a third interlayer dielectric formed over the first interlayer dielectric.

3. The memory device of claim 2, where the third interlayer dielectric comprises boro-phosphosilicate glass.

4. A semiconductor device, comprising:
a plurality of memory cells formed on a substrate;
a continuous layer formed over the plurality of memory cells and physically contacting an upper surface of the substrate, the continuous layer comprising a first material having a refractive index of about 2.5, where the first material comprises a silicon-rich silicon nitride and has a thickness ranging from about 250 Å to about 650 Å;
a conductive layer formed over the continuous layer;
an interlayer dielectric formed over the conductive layer, the interlayer dielectric comprising a material that blocks at least 95 percent of ultraviolet radiation; and
another conductive layer formed over the interlayer dielectric, where the interlayer dielectric includes a contact hole that is filled by a metal layer that connects to the conductive layer and the another conductive layer.

5. The semiconductor device of claim 4, where the continuous layer blocks at least 95 percent of ultraviolet radiation from reaching the plurality of memory cells.

6. The semiconductor memory device of claim 4, where each of the plurality of memory cells comprises:
a tunnel layer formed over the substrate,
a charge storage element formed over the tunnel layer, the charge storage element comprising a dielectric material,
an inter-gate dielectric formed over the charge storage element, and
a control gate formed over the inter-gate dielectric.

7. The semiconductor device of claim 6, where each of the plurality of memory cells is to store two bits of information.

8. A non-volatile memory device, comprising:
a substrate;
a first dielectric material formed over the substrate;
a charge storage element formed over the first dielectric material;
a second dielectric material formed over the charge storage element;
a control gate formed over the second dielectric material;
a continuous first interlayer dielectric formed over the control gate and physically contacting an upper surface of the substrate, the continuous first interlayer dielectric comprising a material that has a refractive index of about 2.5, and has a thickness ranging from about 250 Å to about 650 Å, where the first interlayer dielectric comprises a silicon-rich silicon nitride;
a conductive layer formed over the continuous first interlayer dielectric;
a second interlayer dielectric formed over the conductive layer, the second interlayer dielectric comprising a material that blocks at least 95 percent of ultraviolet radiation;
another conductive layer formed over the second interlayer dielectric, where the second interlayer dielectric includes a contact hole that is filled by a metal layer that connects to the conductive layer and the another conductive layer; and
a cap layer formed over the second interlayer dielectric, the cap layer comprising the material that has a refractive index of about 2.5.

9. The non-volatile memory device of claim 8, where the continuous first interlayer dielectric blocks about 95 percent to about 100 percent of ultraviolet radiation from reaching the control gate.

10. The non-volatile memory device of claim 8, where the charge storage element for each memory cell in the non-volatile memory device is to store two bits of information.

11. The non-volatile memory device of claim 8, where the cap layer has a thickness ranging from about 6,000 Å to about 10,000 Å.

12. The non-volatile memory device of claim 8, where the cap layer blocks at least 95 percent of ultraviolet radiation.

* * * * *